(12) United States Patent
Qu et al.

(10) Patent No.: US 12,100,704 B2
(45) Date of Patent: Sep. 24, 2024

(54) DISPLAY SUBSTRATE, CRACK DETECTION METHOD THEREOF AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yi Qu, Beijing (CN); Junxiu Dai, Beijing (CN); Linhong Han, Beijing (CN); Yang Zhou, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 337 days.

(21) Appl. No.: 17/432,223

(22) PCT Filed: Oct. 27, 2020

(86) PCT No.: PCT/CN2020/123932
§ 371 (c)(1),
(2) Date: Aug. 19, 2021

(87) PCT Pub. No.: WO2022/087815
PCT Pub. Date: May 5, 2022

(65) Prior Publication Data
US 2022/0344325 A1    Oct. 27, 2022

(51) Int. Cl.
   H01L 27/02   (2006.01)
   G01N 27/60   (2006.01)
   H01L 27/12   (2006.01)

(52) U.S. Cl.
   CPC ......... H01L 27/0296 (2013.01); G01N 27/60 (2013.01); H01L 27/0266 (2013.01); H01L 27/124 (2013.01)

(58) Field of Classification Search
   CPC . G01N 27/60; H01L 27/0296; H01L 27/0266; H01L 27/124
   See application file for complete search history.

(56) References Cited

U.S. PATENT DOCUMENTS 5,744,843 A * 4/1998 Efland ................. H01L 23/4824
                                              257/E29.12
11,751,464 B2 * 9/2023 Jiang ...................... G09G 3/006
                                              361/56

(Continued)

FOREIGN PATENT DOCUMENTS

CN    109427752 A    3/2019
CN    109935571 A    6/2019

(Continued)

Primary Examiner — Jeff W Natalini
(74) Attorney, Agent, or Firm — The Webb Law Firm

(57) ABSTRACT

The disclosure relates to a display substrate, including: a base substrate including a display area and a peripheral area surrounding the display area; a first crack detection line located in the peripheral area and surrounding the display area; a second crack detection line located in the peripheral area and surrounding the display area; at least one first electrostatic discharge circuit located in the peripheral area, each including at least one first thin film transistor, the at least one first thin film transistor including a first gate; and at least one second electrostatic discharge circuit located in the peripheral area and electrically connected to the second crack detection line, each including at least one second thin film transistor, the at least one second thin film transistor including a second gate, wherein the second gate is electrically connected to the first gate.

19 Claims, 4 Drawing Sheets

(56) References Cited

U.S. PATENT DOCUMENTS

| | | | |
|---|---|---|---|
| 2018/0047316 A1* | 2/2018 | Zhou | ................... G09F 9/301 |
| 2019/0066595 A1 | 2/2019 | Kim et al. | |
| 2020/0203641 A1* | 6/2020 | Lee | ............... G02F 1/136286 |
| 2021/0359069 A1* | 11/2021 | Wang | ................. H10K 77/10 |

FOREIGN PATENT DOCUMENTS

| | | |
|---|---|---|
| CN | 111445797 A | 7/2020 |
| CN | 111524450 A | 8/2020 |
| KR | 1020190140629 A | 12/2019 |

\* cited by examiner

DISPLAY SUBSTRATE, CRACK DETECTION METHOD THEREOF AND DISPLAY DEVICE

CROSS-REFERENCE TO RELATED APPLICATION

This application is the United States national phase of International Application No. PCT/CN2020/123932 filed Oct. 27, 2020, the disclosure of which is hereby incorporated by reference in its entirety.

TECHNICAL FIELD

The present disclosure relates to the field of display technologies, and particularly to a display substrate, a crack detection method thereof and a display device.

BACKGROUND

With the continuous improvement of OLED (Organic Light-Emitting Diode) technology, greater demands are placed on screens of OLED products. GDS (Gate Data Shot) defect caused by a film crack is one of major defects of the OLED products.

SUMMARY

According to some embodiments of the present disclosure, there is provided a display substrate comprising:
  a base substrate comprising a display area and a peripheral area surrounding the display area;
  a first crack detection line located in the peripheral area and surrounding the display area;
  a second crack detection line located in the peripheral area and surrounding the display area;
  at least one first electrostatic discharge circuit located in the peripheral area, each comprising at least one first thin film transistor, the at least one first thin film transistor comprising a first gate; and
  at least one second electrostatic discharge circuit located in the peripheral area and electrically connected to the second crack detection line, each comprising at least one second thin film transistor, the at least one second thin film transistor comprising a second gate, wherein the second gate is electrically connected to the first gate.

In some embodiments, the display area further comprises:
  a plurality of sub-pixels located in the display area and comprising test sub-pixels and non-test sub-pixels; and
  a cell test circuit located in the peripheral area and electrically connected to the plurality of sub-pixels, the first crack detection line, and the second crack detection line, respectively.

In some embodiments, the first crack detection line comprises a first end and a second end, the first end of the first crack detection line being configured to input a first electrical-signal detection signal, the second end thereof being configured to output a second electrical-signal detection signal, the at least one first electrostatic discharge circuit being electrically insulated from the first crack detection line.

In some embodiments, the cell test circuit comprises at least one test thin film transistor, each comprising a source, a drain and a gate, the at least one test thin film transistor comprises a first set of test thin film transistors, and sources or drains of the first set of test thin film transistors are electrically connected to the test sub-pixels; and the second crack detection line comprises a first end and a second end, the first end of the second crack detection line being configured to input a bright-line detection signal, the second end thereof being electrically connected to the drains or sources of the first set of test thin film transistors.

In some embodiments, the at least one test thin film transistor further comprises a second set of test thin film transistors, sources or drains of the second set of test thin film transistors being electrically connected to the non-test sub-pixels.

In some embodiments, the at least one test thin film transistor is a P-type thin film transistor.

In some embodiments, at least part of the second crack detection line surrounds at least part of the first crack detection line.

In some embodiments, the first crack detection line comprises a first segment of crack detection line and a second segment of crack detection line that are in mirror symmetry, and the second crack detection line comprises a first segment of crack detection line and a second segment of crack detection line that are in mirror symmetry.

In some embodiments, the display substrate further comprises: a common electrode located in the peripheral area and surrounding the display area, wherein the second gate and the first gate are electrically connected to the common electrode respectively.

In some embodiments, the first gate and the second gate are in an integral structure.

In some embodiments, the at least one first thin film transistor comprises an active layer, the first gate located on one side of the active layer away from the base substrate, and a source and a drain located on one side of the gate away from the base substrate, the source and the drain of the at least one first thin film transistor being electrically insulated from the crack detection line; and the at least one second thin film transistor comprises an active layer, the second gate located on one side of the active layer away from the base substrate, and a source and a drain located on one side of the gate away from the base substrate, the source and the drain of the at least one second thin film transistor being electrically connected to the crack detection line.

In some embodiments, the first electrostatic discharge circuit and the second electrostatic discharge circuit are respectively located at both sides of the cell test circuit, and are in mirror symmetry.

In some embodiments, the display area comprises a first boundary, a second boundary, a third boundary, and a fourth boundary; the peripheral area comprises a first peripheral area located outside the first boundary, a second peripheral area located outside the second boundary, a third peripheral area located outside the third boundary, and a fourth peripheral area located outside the fourth boundary; and the common electrode comprises a first portion located in the first peripheral area and a second portion located in the second peripheral area, the third peripheral area, and the fourth peripheral area, and the first gate of the at least one first thin film transistor and the second gate of the at least one second thin film transistor are electrically connected to the first portion of the common electrode respectively.

In some embodiments, at least part of the second crack detection line located in the first peripheral area is located in a same layer as and have a same material as the source and the drain of the at least one second thin film transistor, and at least part of the second crack detection line located in the second peripheral area, the third peripheral area, and the fourth peripheral area is located in a same layer as and have a same material as the gate of the at least one second thin film transistor.

In some embodiments, part of the first crack detection line or the second crack detection line located in the first peripheral area is in a U-shape or L-shape, and a bent part of the U-shape or L-shape has a chamfer.

In some embodiments, the source and the drain of the at least one first thin film transistor are shorted through a metal layer, and are located in a same layer as and have a same material as the metal layer; and
the source and the drain of the at least one second thin film transistor are shorted through the metal layer, and are located in a same layer as and have a same material as the metal layer.

According to other embodiments of the present disclosure, there is provided a crack detection method of a display substrate, the display substrate comprising:
a base substrate comprising a display area and a peripheral area surrounding the display area;
a first crack detection line located in the peripheral area and surrounding the display area, the first crack detection line comprising a first end and a second end;
a second crack detection line located in the peripheral area and surrounding the display area;
at least one first electrostatic discharge circuit located in the peripheral area and electrically insulated from the first crack detection line, each comprising at least one first thin film transistor, the at least one first thin film transistor comprising a first gate; and
at least one second electrostatic discharge circuit located in the peripheral area and electrically connected to the second crack detection line, each comprising at least one second thin film transistor, the at least one second thin film transistor comprising a second gate, wherein the second gate is electrically connected to the first gate,
the crack detection method comprising:
inputting a first electrical-signal detection signal to the first end of the first crack detection line;
receiving a second electrical-signal detection signal from the second end of the first crack detection line; and
deciding whether there is a crack in the display substrate according to the first electrical-signal detection signal and the second electrical-signal detection signal.

In some embodiments, that deciding whether there is a crack in the display substrate according to the first electrical-signal detection signal and the second electrical-signal detection signal comprises:
determining a resistance value between the first end of the first crack detection line and the second end thereof according to the first electrical-signal detection signal and the second electrical-signal detection signal; and
deciding whether there is a crack in the display substrate according to a comparison result of the resistance value and a resistance threshold.

In some embodiments, the crack detection method further comprises disconnecting an electrical connection between the at least one first electrostatic discharge circuit and the first crack detection line.

In some embodiments, the display substrate further comprises:
a plurality of sub-pixels located in the display area and comprising test sub-pixels and non-test sub-pixels; and
a cell test circuit located in the peripheral area and electrically connected to the plurality of sub-pixels, the first crack detection line, and the second crack detection line respectively, the cell test circuit comprising at least one test thin film transistor, each test thin film transistor comprising a source, a drain, and a gate, the at least one test thin film transistor comprising a first set of test thin film transistors, sources or drains of the first set of test thin film transistors being electrically connected to the test sub-pixels;
the second crack detection line comprises a first end and a second end, the first end of the second crack detection line being configured to input a bright-line detection signal, and the second end thereof being electrically connected to the drains or sources of the first set of test thin film transistors, and
the crack detection method further comprises:
inputting a level signal, which makes the at least one test thin film transistor turn off, to the at least one test thin film transistor.

According to still other embodiments of the present disclosure, there is provided a crack detection method of a display substrate, the display substrate comprising:
a base substrate comprising a display area and a peripheral area surrounding the display area;
a plurality of sub-pixels located in the display area and comprising test sub-pixels and non-test sub-pixels;
a cell test circuit located in the peripheral area and electrically connected to the plurality of sub-pixels, the cell test circuit comprising at least one test thin film transistor, each test thin film transistor comprising a source, a drain and a grid, the at least one test thin film transistor comprising a first set of test thin film transistors, and sources or drains of the first set of test thin film transistors being electrically connected to the test sub-pixels;
a first crack detection line located in the peripheral area and surrounding the display area, and electrically connected to the cell test circuit;
a second crack detection line located in the peripheral area and surrounding the display area, the second crack detection line comprising a first end and a second end, the first end of the second crack detection line being configured to input a bright-line detection signal, and the second end thereof being electrically connected to the drains or sources of the first set of test thin film transistors;
at least one first electrostatic discharge circuit located in the peripheral area, each first electrostatic discharge circuit comprising at least one first thin film transistor, the at least one first thin film transistor comprising a first gate; and
at least one second electrostatic discharge circuit located in the peripheral area and electrically connected to the second crack detection line, each second electrostatic discharge circuit comprising at least one second thin film transistor, the at least one second thin film transistor comprising a second gate, wherein the second gate is electrically connected to the first gate,
the crack detection method comprising:
inputting a first level signal to gates of the first set of test thin film transistors to turn on the first set of test thin film transistors, and inputting a bright-line detection signal to the first end of the first crack detection line to detect an emission state of the test sub-pixels.

In some embodiments, the bright-line detection signal is a constant voltage signal, a voltage value of the constant voltage signal being greater than a voltage threshold.

In some embodiments, the at least one test thin film transistor further comprises a second set of test thin film transistors, and sources or drains of the second set of test thin film transistors being electrically connected to the non-test sub-pixels, and the crack detection method further comprises:
inputting the first level signal to gates of the second set of test thin film transistors to turn on the second set of test thin film transistors, and inputting a second level signal to the drains or sources of the second set of test thin film transistors to make the non-test sub-pixels be in a dark state.

According to further embodiments of the present disclosure, there is provided a display device comprising the display substrate according to any of the foregoing embodiments.

BRIEF DESCRIPTION OF THE DRAWINGS

The accompanying drawings, which constitute a part of this specification, illustrate embodiments of the present disclosure and, together with this specification, serve to explain the principles of the present disclosure.

The present disclosure may be more clearly understood from the following detailed description with reference to the accompanying drawings, in which.

DETAILED DESCRIPTION

Figure 1:
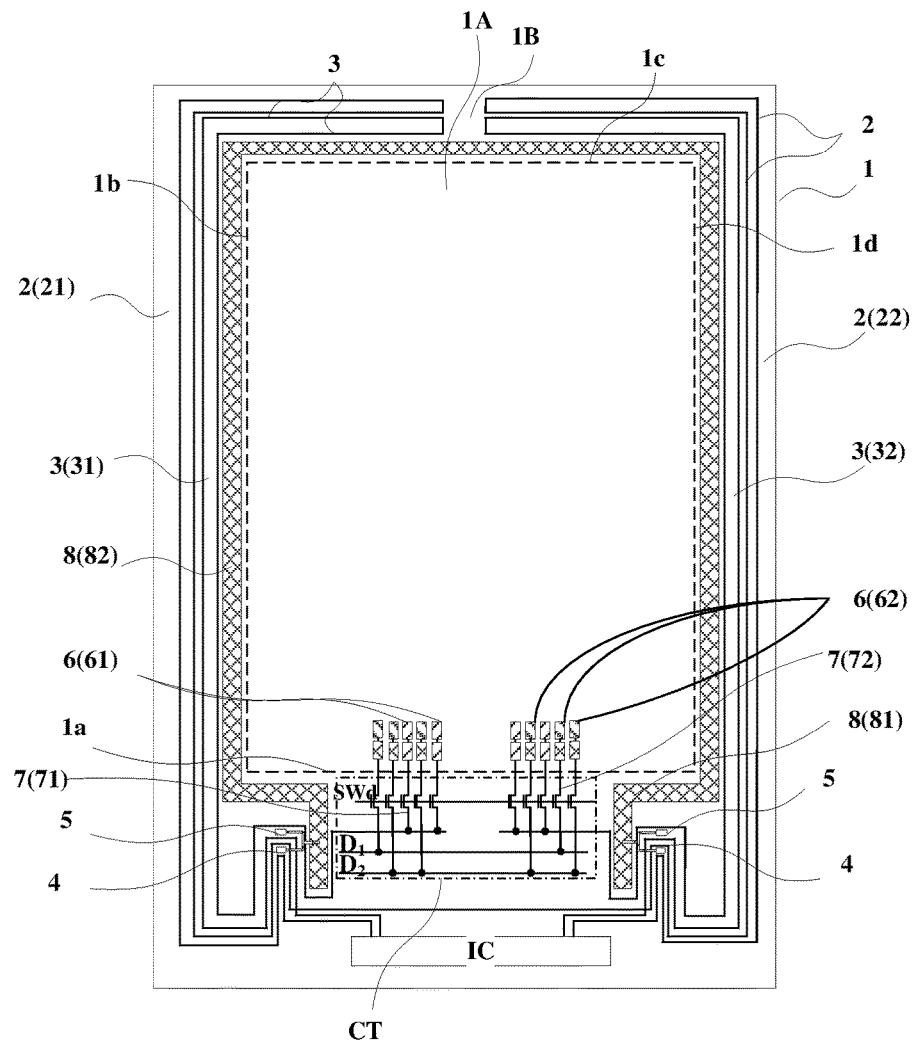
FIG. 1 is a schematic diagram of area distribution of a display substrate according to an embodiment of the present disclosure.

Exemplary embodiments of the present disclosure will now be described in detail with reference to the accompanying drawings. The description of the exemplary embodiments is merely illustrative and is in no way intended to limit this disclosure, its application, or uses. The present disclosure can be implemented in many different forms and is not limited to the embodiments described herein. These embodiments are provided to make the present disclosure thorough and complete, and fully convey the scope of the present disclosure to those skilled in the art. It should be noted that: the relative arrangement of components and steps, composition of materials, numerical expressions and numerical values set forth in these embodiments are construed to be merely illustrative instead of restrictive, unless specifically stated otherwise.

The words "first," "second," and the like used in the present disclosure do not indicate any sequence, number, or importance, but is merely used to distinguish different parts. The word "comprising" or "including", or the like, means that an element preceding the word covers a listed element following the word, and does not preclude the possibility that other elements may also be covered. The words "up", "down", "left", "right", and so on, are merely used to indicate relative position relations, and when an absolute position of a described object changes, the relative position relations may also change correspondingly.

In the present disclosure, when a particular device is described between a first device and a second device, an intervening device may or may not exist between the particular device and the first device or the second device. When a particular device is described to be connected to another device, it can be directly connected to the other device without an intervening device, or can be indirectly connected to the other device with an intervening device.

All terms (including technical or scientific terms) used in this disclosure have the same meanings as those commonly understood by one of ordinary skill in the art to which this disclosure belongs unless specifically defined otherwise. It will be also understood that terms defined in, e.g., common dictionaries, should be interpreted as having meanings consistent with their meanings in the context of the related art and will not be interpreted with idealized or extremely formalized meanings unless expressly defined herein.

Techniques, methods, and apparatus known to one of ordinary skill in the related art may not be discussed in detail, but are intended to be regarded as a part of the specification where appropriate.

At present, PCD (Panel Crack Detection) is widely used for film crack detection. There are mainly two types of PCD detection: electrical-signal detection and bright-line detection, wherein the electrical-signal detection is usually resistance detection, and implemented by, for example, detecting a resistance at both ends of a peripheral metal winding, whose resistance value will deviate from a reference value when a crack occurs in PCD; and the bright line detection is also called voltage detection, that is, the peripheral metal winding is connected to a data line in the display area, and a bright line will appear on the screen when a crack occurs in PCD. A PCD line of the OLED display screen is longer, and it is easy to accumulate static electricity in the process. If the accumulated static electricity cannot be discharged in time, the static electricity may break down a driving Thin Film Transistor (TFT) adjacent to the PCD line in the panel or a TFT of a scan cell, such that emission of individual pixels fails or the entire panel fails.

After research, however, inventors have found that since the breakdown effect of ESD will affect the detection result of the PCD, for example, cause signal disturbance of the PCD, it is easy to cause PCD over-detection, thereby reducing the accuracy of crack detection.

In view of the above, the embodiments of the present disclosure provide a display substrate, a manufacturing method thereof, a crack detection method, a display panel, and a display device, which can realize a variety of PCD detection modes and can effectively improve the accuracy of the PCD.

FIG. 1 is a schematic diagram of area distribution of a display substrate according to an embodiment of the disclosure.

Referring to FIG. 1, in some embodiments, the display substrate comprises a base substrate 1, a first crack detection line 2, a second crack detection line 3, at least one first electrostatic discharge circuit 4, and at least one second electrostatic discharge circuit 5.

A material employed for the base substrate 1 can be glass, ceramic, polyimide, or the like. The base substrate 1 comprises a display area 1A and a peripheral area 1B surrounding the display area 1A.

In FIG. 1, the display area 1A comprises: a first boundary 1a, a second boundary 1b, a third boundary 1c, and a fourth boundary 1d. The first boundary 1a is opposite to the third boundary 1c, and the second boundary 1b is opposite to the fourth boundary 1d. The peripheral area 1B is located outside the display area 1A (i.e., on one side in a direction away from the display area 1A), and belongs to an non-display area. The peripheral area 1B comprises a first peripheral area located outside the first boundary 1a, a second peripheral area located outside the second boundary 1b, a third peripheral area located outside the third boundary 1c, and a fourth peripheral area located outside the fourth boundary 1d. For example, as shown in FIG. 1, the first peripheral area is a peripheral area located below the first boundary 1a, the second peripheral area is a peripheral area located on a left side of the second boundary 1b, the third peripheral area is a peripheral area located above the third boundary 1c, and the fourth peripheral area is a peripheral area located on a right side of the fourth boundary 1d.

The first crack detection line 2 is located in the peripheral area 1B and surrounds the display area 1A. In some embodiments, as shown in FIG. 1, the first crack detection line 2 comprises a first segment of crack detection line 21 and a second segment of crack detection line 22 that are in mirror symmetry.

As shown in FIG. 1, the first segment of crack detection line 21 of the first crack detection line 2 is located in a first portion of the first peripheral area (e.g. a left half of the first peripheral area), the second peripheral area and a first portion of the third peripheral area (e.g. a left half of the third peripheral area). The second segment of crack detection line 22 is located in a second portion of the first peripheral area (e.g. a right half of the first peripheral area), the fourth peripheral area and a second portion of the third peripheral area (e.g. a right half of the third peripheral area).

The first crack detection line 2 comprises a first end and a second end. When an electrical signal is employed for crack detection, the first end of the first crack detection line 2 is configured to input a first electrical-signal detection signal, and the second end thereof is configured to output a second electrical-signal detection signal.

The second crack detection line 3 is located in the peripheral area 1B and surrounds the display area 1A. Similar to the first crack detection line 2, the second crack detection line 3 can also comprise a first segment of crack detection line 31 and a second segment of crack detection line 32 that are in mirror symmetry.

Similar to the first crack detection line 2, the first segment of crack detection line 31 of the second crack detection line 3 is located in the first portion of the first peripheral area, the second peripheral area and the first portion of the third peripheral area. The second segment of crack detection line 32 is located in the second portion of the first peripheral area, the fourth peripheral area and the second portion of the third peripheral area.

As shown in FIG. 1, the second crack detection line 3 comprises a first end and a second end. When a bright line is employed for crack detection, the first end of the second crack detection line 3 is configured to input a bright-line detection signal for deciding whether there is a crack in a film.

In some implementations, at least part of the second crack detection line 3 surrounds at least part of the first crack detection line 2.

Electrostatic discharge circuits used in conjunction with the crack detection lines will be described below.

As shown in FIG. 1, at least one first electrostatic discharge circuit 4 is located in the peripheral area 1B, and electrically insulated from the first crack detection line 2 for realizing electrostatic discharge of the first crack detection line 2. For example, in FIG. 1, two first electrostatic discharge circuits 4 located at different positions are electrically connected to the first crack detection line 2 respectively. It should be understood that the first electrostatic discharge circuits 4 can also be provided at other positions electrically connected to the first crack detection line 2. Each of the first electrostatic discharge circuits 4 comprises at least one first thin film transistor. The at least one first thin film transistor comprises a first gate, and the first gate herein can be jointly formed by electrically connecting the gate of each of the at least one first thin film transistor.

In some embodiments, the at least one first thin film transistor comprises an active layer, the first gate on one side of the active layer away from the base substrate, and a source and a drain on one side of the gate away from the base substrate, the source and the drain of the at least one first thin film transistor being electrically insulated from the crack detection line. The source and the drain of the at least one first thin film transistor are shorted through a metal layer, and are located in a same layer as and have a same material as the metal layer.

As shown in FIG. 1, at least one second electrostatic discharge circuit 5 is located in the peripheral area 1B, and is electrically connected to the second crack detection line 3 for realizing electrostatic discharge of the second crack detection line 3. Similarly, each of the second electrostatic discharge circuits 5 can be provided at any position electrically connected to the second crack detection line 3. Each of the second electrostatic discharge circuits 5 comprises at least one second thin film transistor. In some embodiments, the at least one second thin film transistor comprises an active layer, a second gate on one side of the active layer away from the base substrate, and a source and a drain on one side of the second gate away from the base substrate, the source and the drain of the at least one second thin film transistor being electrically connected to the crack detection line, the second gate being electrically connected to the first gate. For example, a second gate of one second electrostatic discharge circuit 5 can be electrically connected to a first gate of a first electrostatic discharge circuit 4 adjacent to the second electrostatic discharge circuit 5. The second gate herein can be jointly formed by electrically connecting the gate of each of the at least one second thin film transistor. A common-gate structure of the first electrostatic discharge circuit 4 and the second electrostatic discharge circuit 5 will be described in detail hereinafter in conjunction with FIG. 4.

In some embodiments, the source and the drain of the at least one second thin film transistor are shorted through a metal layer, and are located in a same layer as and have a same material as the metal layer. In some embodiments, at least part of the second crack detection line located in the first peripheral area is located in a same layer as and has a same material as the source and the drain of the at least one second thin film transistor, and at least part of the second crack detection line located in the second peripheral area, the third peripheral area, and the fourth peripheral area is located in a same layer as and has a same material as the gate of the at least one second thin film transistor.

As shown in FIG. 1, the display substrate further comprises a common electrode 8 located in the peripheral area 1B and surrounding the display area 1A. In some embodiments, the first electrostatic discharge circuit 4 (first gate) and the second electrostatic discharge circuit 5 (second gate) are electrically connected to the common electrode 8 respectively. The common electrode 8 comprises a first portion 81 located in the first peripheral area and a second portion 82 located in the second peripheral area, the third peripheral area, and the fourth peripheral area, wherein the first electrostatic discharge circuit 4 and the second thin film transistor 5 are electrically connected to the first portion 81 of the common electrode 8 respectively.

As shown in FIG. 1, part of the first crack detection line or the second crack detection line located in the first peripheral area is in a U-shape or L-shape, and a bent part of the U-shape or L-shape can have a chamfer.

In the above embodiment, the display substrate comprises the first crack detection line 2, the second crack detection line 3, at least one first electrostatic discharge circuit 4 electrically connected to the first crack detection line 2, and at least one second electrostatic discharge circuit 5 electrically connected to the second crack detection line 3, and the gate of the first thin film transistor in the first electrostatic discharge circuit 4 is electrically connected to the gate of the second thin film transistor in the second electrostatic discharge circuit 5. The first electrostatic discharge circuit 4 and the second electrostatic discharge circuit 5 whose gates are electrically connected can protect each other, to improve the stability and reliability of the electrostatic discharge circuits, reduce the effects of the breakdown effect of the ESD on the result of the PCD, and reduce the possibility of PCD over-detection, thereby further improving the accuracy of film crack detection.

As shown in FIG. 1, in some embodiments, the display substrate can further comprise a plurality of sub-pixels 6 and a cell test circuit CT in the display area 1A. In some embodiments, the first electrostatic discharge circuit 4 and the second electrostatic discharge circuit 5 are respectively located on both sides of the cell test circuit CT, and are in mirror symmetry.

The plurality of sub-pixels 6 comprises test sub-pixels 61 and non-test sub-pixels 62. Each of the sub-pixels can display any of red, green and blue, thereby enabling the display substrate to present a picture.

The cell test circuit CT is located in the peripheral area 1B, and is electrically connected to the plurality of sub-pixels 6, the first crack detection line 2, and the second crack detection line 3 respectively. The cell test circuit CT comprises at least one test thin film transistor (TFT) 7. The at least one test thin film transistor 7 can be a P-type thin film transistor or an N-type thin film transistor. Each test thin film transistor 7 comprises a source, a drain, and a gate. As shown in FIG. 1, the gates of the test thin film transistors 7 are all connected to a switch signal line SWd. The at least one test thin film transistor comprises a first set of test thin film transistors 71, one of the source and the drain of each thin film transistor in the first set of test thin film transistors 71 is electrically connected to the test sub-pixel 61, and the other thereof is electrically connected to the second crack detection line 3. In some embodiments, the at least one test thin film transistor 7 further comprises a second set of test thin film transistors 72, one of the source and the drain of each thin film transistor in the second set of test thin film transistors 72 is electrically connected to the non-test sub-pixel 62, and the other thereof is electrically connected to signal lines (also called control voltage lines) $D_1$ and $D_2$.

In the case where the sources of the first set of test thin film transistors 71 are electrically connected to the test sub-pixels 61, the second crack detection line 3 is electrically connected to the drains of the first set of test thin film transistors 71. Alternatively, in the case where the drains of the first set of test thin film transistors 71 are electrically connected to the test sub-pixels 61, the second crack detection line 3 is electrically connected to the sources of the first set of test thin film transistors 71. In other words, the test sub-pixels 61 are electrically connected to the second crack detection line 3 via the first set of test thin film transistors 71.

In the above embodiment, the two crack detection lines can respectively employ different PCD detection modes for film crack detection. Therefore, the accuracy of film crack identification can be improved by integrating a number of crack detection results.

A crack detection method of the display substrate will be described below in conjunction with FIGS. 1 and 2, by taking the first crack detection line employing the electrical-signal detection as an example.

Figure 2:
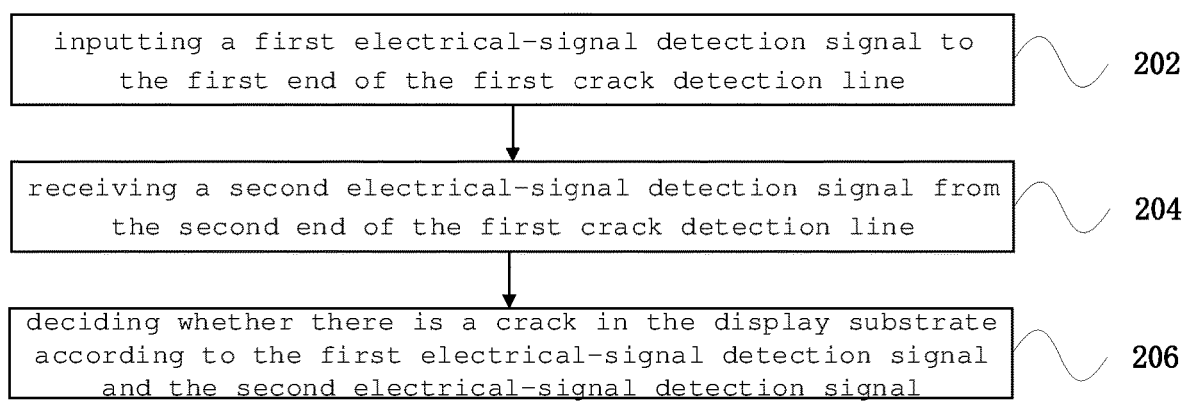
FIG. 2 is a crack detection method of a display substrate according to an embodiment of the present disclosure.

FIG. 2 is a crack detection method of a display substrate according to an embodiment of the present disclosure. As shown in FIG. 2, the crack detection method of the embodiment comprises the following steps 202 to 206.

Step 202, inputting a first electrical-signal detection signal to the first end of the first crack detection line 2. For example, the first electrical-signal detection signal is, for example, a voltage signal of +2.5V.

Step 204, receiving a second electrical-signal detection signal from the second end of the first crack detection line 2. Step 206, deciding whether there is a crack in the display substrate according to the first electrical-signal detection signal and the second electrical-signal detection signal.

In some embodiments, first, a resistance value between the first end of the first crack detection line 2 and the second end thereof is determined according to the first electrical-signal detection signal and the second electrical-signal detection signal; and then, it is decided whether there is a crack in the display substrate according to a comparison result of the resistance value and a resistance threshold.

For example, a multimeter can be employed to determine the resistance value between the first end of the first crack detection line 2 and the second end thereof; when the measured resistance value (e.g., 1 KΩ (kilo-ohm)) is less than the resistance threshold (e.g., 100 KΩ), it is decided that there is no crack in the display substrate, and when the measured resistance value (e.g., 150 KΩ) is greater than the resistance threshold (e.g., 100 KΩ), it is decided that there is a crack in the display substrate.

In some embodiments, the crack detection method further comprises: disconnecting an electrical connection between the at least one first electrostatic discharge circuit 4 and the first crack detection line 2. In this way, the effects of the breakdown effect of the ESD on the detection signal of the PCD can be reduced, and the accuracy of the PCD is further improved.

In other embodiments, the crack detection method based on the electrical signals further comprises: inputting a level signal, which makes the at least one test thin film transistor 7 turn off, to the at least one test thin film transistor 7. For example, in the case that the at least one test thin film transistor 7 is a P-type thin film transistor, the at least one test thin film transistor 7 turns off by inputting a level signal $V_{GH}$ (e.g., +7V) to a switch signal line SWd. A signal line connected to the second crack detection line 3 can be configured in a high-resistance state. In this way, the effects of other crack detection structural components on the detection result of the crack detection method can be reduced, and the result accuracy of the crack detection method above is further improved.

It should be noted that the second crack detection line can also employ the structure of the first crack detection line above and employ the crack detection method based on the electrical signals for crack detection, which will not be described in detail herein.

As described above, the PCD detection modes comprise the bright-line detection in addition to the electrical-signal detection. Another crack detection method of a display substrate will be described in conjunction with FIGS. 1 and 3, by taking the second crack detection line employing the bright-line detection as an example.

Figure 3:
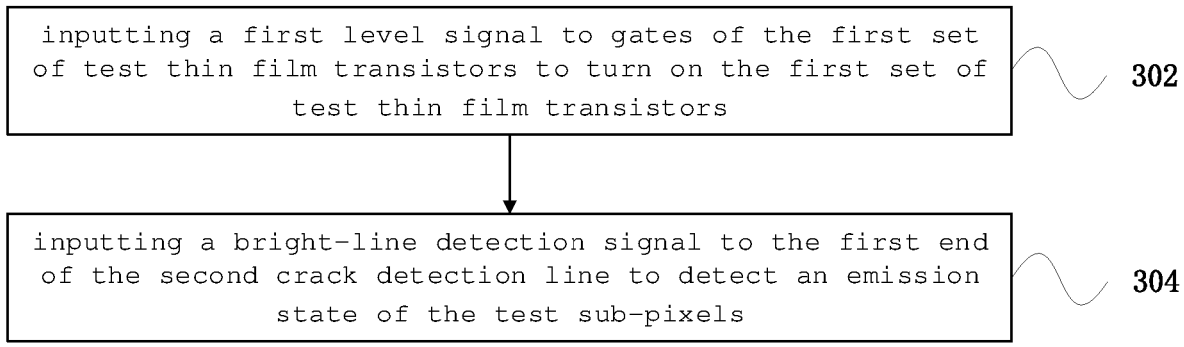
FIG. 3 is a crack detection method of a display substrate according to another embodiment of the present disclosure.

FIG. 3 is a crack detection method of a display substrate according to another embodiment of the present disclosure.

As shown in FIG. 3, the crack detection method of the embodiment comprises steps 302 to 304.

Step 302, inputting a first level signal to gates of the first set of test thin film transistors 71 to turn on the first set of test thin film transistors 71.

Step 304, inputting a bright-line detection signal to the first end of the second crack detection line 3 to detect an emission state of the test sub-pixels 61. In some embodiments, the bright-line detection signal is a constant voltage signal, a voltage value of the constant voltage signal being greater than a voltage threshold (e.g., +6V). In this way, after the second electrostatic discharge circuit 5 is connected, the breakdown effect of the second electrostatic discharge circuit 5 has no effect on the normal operation of the bright-line detection, that is, PCD over-detection will not occur, and thus, the result accuracy of the crack detection method is further improved.

For example, first, in the case that the at least one test thin film transistor 7 is a P-type thin film transistor, the at least one test thin film transistor 7 turns on by inputting a level signal $V_{GL}$ (e.g., −7V) to the switch signal line SWd. Next, by inputting a bright-line detection signal (e.g., +7V) to the signal line, the bright-line detection signal is input from the first end of the second crack detection line 3, passes through the second crack detection line 3, and then is transmitted from the second crack detection line 3 to the test sub-pixels 61. In the bright-line detection, a signal is input through a data line of IC, so that the screen is in a dark state. When the display substrate has no crack or a small crack, the second crack detection line 3 does not have a break, and the test sub-pixels 61 in the display area all in the dark state. If there is a large crack in the display substrate, which results in a break in the second crack detection line 3, the test sub-pixels 61 of the display area emit light, bright lines in a dark picture in the display area appear, thereby determining the occurrence of the crack in the display substrate.

In some embodiments, the crack detection method further comprises: inputting the first level signal to gates of the second set of test thin film transistors 72 to turn on the second set of test thin film transistors 72, and inputting a second level signal to the drains or sources of the second set of test thin film transistors 72 to make the non-test sub-pixels 62 be in the dark state. For example, the second level signal (for example, +7V) is input through the signal lines $D_1$ and $D_2$, and the second level signal is transmitted to the non-test sub-pixels 62 through the second set of test thin film transistors 72, so that the non-test sub-pixels 62 are all in the dark state, which is more beneficial to displaying the detection result of the test sub-pixels, and thus more convenient to realize the above crack detection method.

In the above embodiment, since the second electrostatic discharge circuit 5 is protected by the first electrostatic discharge circuit 4 in common-gate with the second electrostatic discharge circuit 5, the stability and reliability of the operation of the second electrostatic discharge circuit 5 are improved, thereby improving the accuracy of the PCD.

Of course, the first crack detection line can also employ the structure of the second crack detection line above and employ the bright-line detection for crack detection, which will not be described in detail herein.

It should be understood that the above two crack detection methods can be respectively employed for crack detection in the embodiment of the present disclosure, and then the detection results of the two crack detection methods are integrated, so as to improve the accuracy of the PCD of the product screen.

The electrostatic discharge circuits will be further described below in conjunction with FIGS. 4A and 4B.

Figure 4A:
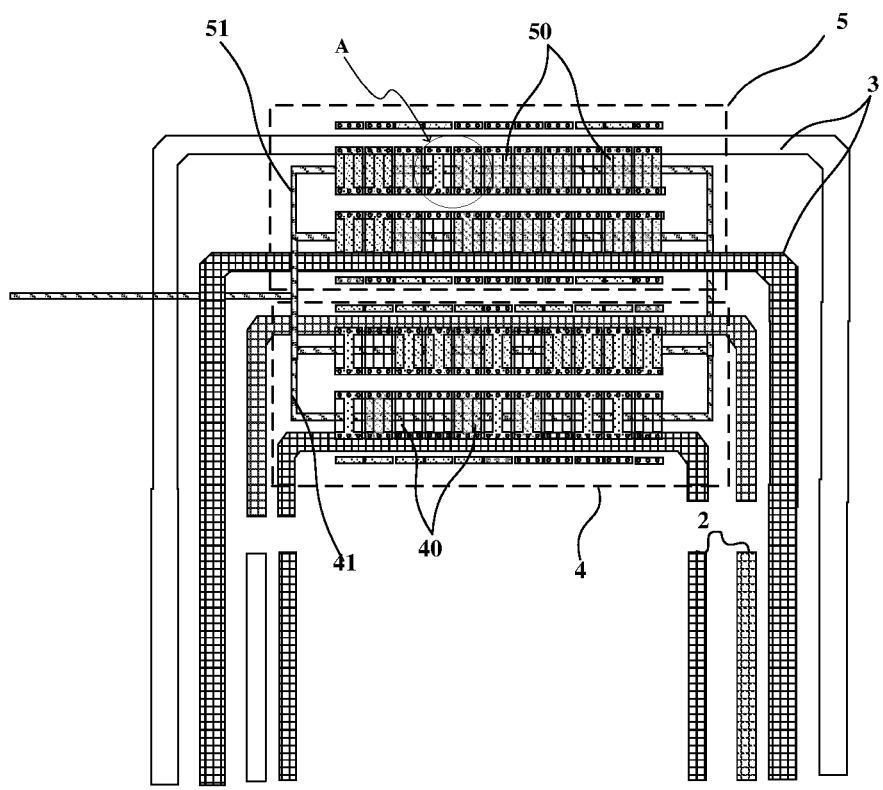
FIG. 4A is a design schematic diagram of a first electrostatic discharge circuit and a second electrostatic discharge circuit of a display substrate according to an embodiment of the present disclosure.

FIG. 4A is a design schematic diagram of a first electrostatic discharge circuit and a second electrostatic discharge circuit of a display substrate according to an embodiment of the present disclosure.

A common-gate structure (i.e., a connection structure between the first gate 41 and the second gate 51) of one of the at least one first electrostatic discharge circuit 4 and a second electrostatic discharge circuit 5 adjacent to the first electrostatic discharge circuit 4 will be explained below in conjunction with FIG. 4A.

Referring to FIG. 4A, the first electrostatic discharge circuit 4 comprises two rows of the first thin film transistors 40 arranged in parallel. The first thin film transistors 40 in each row of the first thin film transistors 40 are arranged in an extension direction of the first crack detection line 2. Both sources and drains of the first thin film transistors 40 in each row of the first thin film transistors 40 are electrically insulated from the first crack detection line 2. Gates of the first thin film transistors 40 in each row of the first thin film transistors 40 are sequentially connected in an arrangement direction of the row of the first thin film transistors 40, and the gates of the rows of the first thin film transistors 40 are connected to each other on both sides in the extension direction of the first crack detection line 2. The gates of the two rows of first thin film transistors 40 are electrically connected to form the first gate 41 jointly.

The specific arrangement of the second electrostatic discharge circuits 5 is different from that of the first electrostatic discharge circuits 4 in that, the crack detection line electrically connected to the second electrostatic discharge circuit 5 is the second crack detection line 3 and the sources and drains of the second thin film transistors 50 in each row of the second thin film transistors 50 are electrically connected to the second crack detection line 3, and so on, which will not be repeated herein. The gates of the two rows of the second thin film transistors 50 are electrically connected to form the second gate 51 jointly. The second gate 51 and the first gate 41 are connected to each other on both sides in the extension direction of the crack detection line.

Figure 4B:
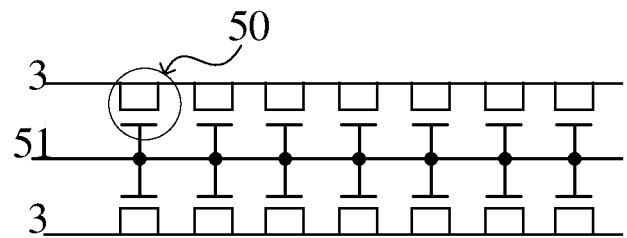
FIG. 4B is a principle schematic diagram of an electrostatic discharge circuit in a display substrate according to an embodiment of the present disclosure.

FIG. 4B is a principle schematic diagram of an electrostatic discharge circuit in a display substrate according to an embodiment of the present disclosure. The second electrostatic discharge circuit 5 shown in FIG. 4A will be described as an example.

As shown in FIG. 5, the source and the drain of the second thin film transistor 50 in the second electrostatic discharge circuit 5 are electrically connected. The source and the drain of the second thin film transistor 50 are electrically connected to the second crack detection line. The second gate 51 of the second thin film transistor 50 can be set to a negative constant voltage. For example, an access voltage Vss of the first gate 41 and the second gate 51 is −3V to −4V.

By employing the above connection mode, the second thin film transistor 50 in the second electrostatic discharge circuit 5 is equivalent to a capacitor, wherein the source and the drain of the second thin film transistor 50 are equivalent to one plate of the capacitor, and the gate of the second thin film transistor 50 is equivalent to the other plate of the capacitor. By keeping the second gate 51 and the first gate 41 at a low potential, static charges can be discharged through the first thin film transistor 40 and the second thin film transistor 50 when the crack detection line produces static charges. In the embodiment of the present disclosure, by designing a dual electrostatic discharge circuit with the common-gate structure, it can be ensured that the access voltage of the first gate 41 and the second gate 51 is uniform and stable, and thus the normal operation of the electrostatic discharge circuit is realized.

Figure 5A:
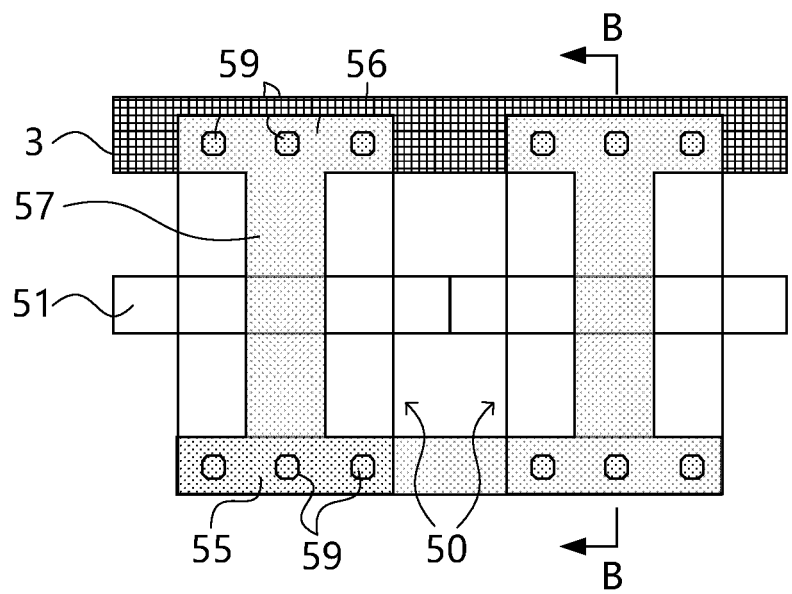
FIG. 5A is a schematic diagram of enlargement of a circle A in FIG. 4A.
Figure 5B:
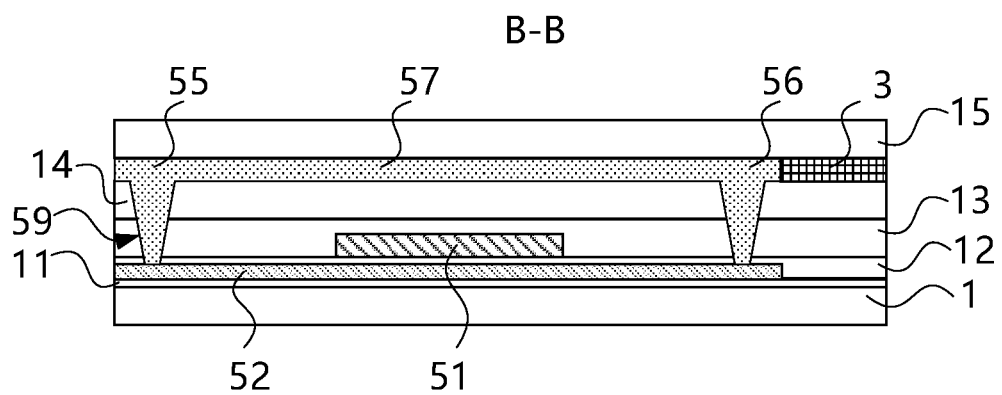
FIG. 5B is a schematic diagram of a structure of a B-B cross section in FIG. 5A.

FIG. 5A is a schematic diagram of enlargement of a circle A in FIG. 4A. FIG. 5B is a schematic diagram of a structure of a B-B cross section in FIG. 5A.

Referring to FIGS. 4A to 5B, in some embodiments, the at least one electrostatic discharge circuit 5 comprises at least one TFT 50. As shown in FIG. 5B, the TFT 50 comprises an active layer 52, a gate 51 on one side of the active layer 52 away from the base substrate 1, and a source 55 and a drain 56 on one side of the gate 51 away from the base substrate 1. The source 55 and the drain 56 of the TFT 50 are electrically connected to the second crack detection line 3, and are electrically connected to the active layer 52. The gate 51 of the TFT 50 is electrically connected to the common electrode 8. The active layer 52 may employ a polysilicon material. In FIG. 4A, part of the second crack detection line 3 is bent into a U-shape in the first peripheral area, and the TFT 50 in the electrostatic discharge circuit 5 is located in a bottom region of the U-shape. The bent part of the U-shape can be provided with a chamfer to reduce the risk of point discharge.

Referring to FIGS. 5A to 5B, in some embodiments, the source 55 and the drain 56 of the TFT 50 are shorted through a metal layer 57, and the source 55 and the drain 56 are in a same layer as and have a same material as the metal layer 57. For example: the source 55 and the drain 56 of the TFT 50, together with the metal layer 57, employ a conductive material such as molybdenum, copper, aluminum, gold, silver, or titanium. In this way, the source 55 and the drain 56, together with the metal layer 57, can be formed through a same patterning process to simplify the manufacturing procedure. The same layer and the same material herein and hereinafter can be a layer structure formed by using a same film forming process to form a film for formation of specific patterns, and then using a same mask plate to pattern the film through one patterning process. Depending on different specific patterns, the one patterning process may comprise a plurality of exposure, development, or etching processes, and the specific patterns in the formed layer structure can be continuous or discontinuous. These specific patterns may also be at different heights or have different thicknesses.

Referring to FIG. 5B, in some embodiments, a wiring and layer-changing technique of the PCD line is employed while the electrostatic discharge circuits are employed for the discharge of the PCD line. That is, the at least part of the second crack detection line 3 located in the first peripheral area is made to be located in a same layer as and has a same material as the source 55 and the drain 56 of the at least one TFT 50, so that the at least part of the second crack detection line 3 of this area is enabled to, together with the source 55 and the drain 56 of the at least one TFT 50, be formed through the same patterning process, so as to simplify the manufacturing procedure. Moreover, the at least part of the second crack detection line 3 located in the second, third, and fourth peripheral areas are also made to be located in a same layer as and has a same material as the gate 51 of the at least one TFT 50, thereby reducing a conductor area with the antenna effect by interlayer jumpers of the second crack detection line 3, and discharging static electricity accumulated on the second crack detection line 3 into the TFT 50.

In FIG. 4A, the gates 51 of each row of the TFTs 50 can be sequentially connected in the arrangement direction of the row of the TFTs 50. The gates 51 of the rows of the TFTs 50 are connected to each other on both sides in the arrangement direction of the row of the TFTs 50. For the electrostatic discharge circuit having the two rows of the TFTs 50, the connected gates 51 of the two rows of the TFTs 50 can be in a ring shape and led out, so as to be electrically connected to the common electrode 8.

Referring to FIG. 5B, in some embodiments, the display substrate 1 further comprises: a first gate insulating layer 12, a second gate insulating layer 13, and an interlayer insulating layer 14. The first gate insulating layer 12 is located on one side of the base substrate 1 adjacent to the gate 51 of the at least one TFT 50 and covers the active layer 52 of the at least one TFT 50. The second gate insulating layer 13 is located on one side of the first gate insulating layer 12 away from the base substrate, and covers the gate 51 of the at least one TFT 50. The interlayer insulating layer 14 is located on one side of the second gate insulating layer 13 away from the base substrate 1. In FIG. 5B, a buffer layer 11 can be provided on the base substrate 1, and the active layer 52 can be provided on a surface of the buffer layer 11. In other embodiments, the active layer 52 can be provided directly on a surface of the base substrate 1.

As shown in FIG. 5B, the source 55 and the drain 56 are provided on one side of the interlayer insulating layer 14 away from the base substrate 1, and are electrically connected to the active layer 52 through at least one first via 59 passing through the interlayer insulating layer 14, the second gate insulating layer 13, and the first gate insulating layer 12. In FIG. 5A, the source 55 and the drain 56 of the TFT 50 are both electrically connected to the active layer 52 through three first vias 59. The display substrate 1 further comprises a planarization layer 15 located on one side of the interlayer insulating layer 14 away from the substrate 1, the planarization layer 15 covering the source 55 and the drain 56 of the at least one TFT 50.

According to another aspect of the embodiments of the present disclosure, there is provided a manufacturing method of a display substrate. This will be explained below in conjunction with FIG. 6.

Figure 6:
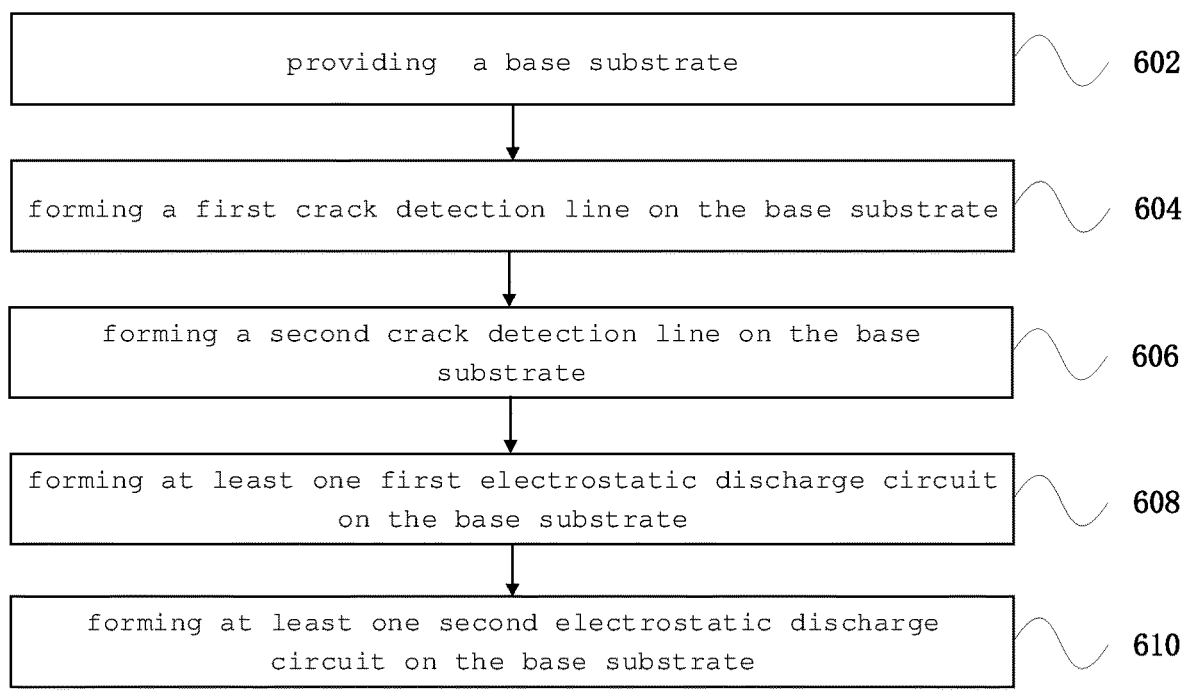
FIG. 6 is a schematic flow diagram of a manufacturing method of a display substrate according to an embodiment of the present disclosure.

FIG. 6 is a schematic flow diagram of a manufacturing method of a display substrate according to an embodiment of the present disclosure.

As shown in FIG. 6, the manufacturing method of the display substrate comprises steps 602 to 610.

Step 602, providing a base substrate. The base substrate comprises a display area and a peripheral area surrounding the display area.

Step 604, forming a first crack detection line on the base substrate. The first crack detection line is located in the peripheral area and surrounds the display area.

Step 606, forming a second crack detection line on the base substrate. The second crack detection line is located in the peripheral area and surrounds the display area.

Step 608, forming at least one first electrostatic discharge circuit on the base substrate. The at least one first electrostatic discharge circuit is located in the peripheral area. Each first electrostatic discharge circuit comprises at least one first thin film transistor. The at least one first thin film transistor comprises a first gate.

Step 610, forming at least one second electrostatic discharge circuit on the base substrate. The at least one second electrostatic discharge circuit is located in the peripheral area and electrically connected to the second crack detection line. Each second electrostatic discharge circuit comprises at least one second thin film transistor. The at least one second thin film transistor comprises a second gate. The second gate is electrically connected to the first gate.

It should be understood that the execution sequence of the steps 604 to 610 in the above embodiment is only illustrative and is not intended to limit the scope of the present disclosure. For example, the manufacturing method above can also perform the step 608 first and then perform the step 606.

In the above embodiment, the design of the first electrostatic discharge circuit and its common-gate structure can ensure the uniformity and stability of etching when the display substrate is manufactured by using a backplane process.

In some embodiments, the at least part of the first crack detection line and the at least part of the second crack detection line are formed in the same-process film. For example, the at least part of the first crack detection line and the at least part of the second crack detection line can both be formed in the same film by employing the backplane process. Of course, the at least part of the first crack detection line and the at least part of the second crack detection line can also be formed in different films. For example, for an FMLOC (Flexible Multiple Layer On Cell) product, the first crack detection line and the second crack detection line can be respectively provided in different films.

The embodiments of the above display substrate disclosed can be applied to various display panels and display devices. Therefore, the present disclosure further provides a display panel, e.g. an AMOLED display panel comprising the foregoing display substrate. The present disclosure further provides a display device comprising the foregoing display panel. The display device can be: any product or component with a display function, such as a mobile phone, a tablet computer, a television set, a display, a notebook computer, a digital photo frame, a navigator and the like.

Thus far, the embodiments of the present disclosure have been described in detail. Some details well known in the art have not been described in order to avoid obscuring the concepts of the present disclosure. Those skilled in the art can now fully appreciate how to implement the technical solution disclosed herein, in view of the foregoing description.

Although some specific embodiments of the present disclosure have been described in detail by means of examples, it should be understood by those skilled in the art that the above examples are for illustration only and are not intended to limit the scope of the present disclosure. It will be understood by those skilled in the art that modifications to the above embodiments or equivalent substitutions for partial technical features thereof can be made without departing from the scope and spirit of the present disclosure. The scope of the present disclosure is defined by the attached claims.

What is claimed is:

1. A display substrate comprising:
   a base substrate comprising a display area and a peripheral area surrounding the display area;
   a first crack detection line located in the peripheral area and surrounding the display area;
   a second crack detection line located in the peripheral area and surrounding the display area, wherein at least part of the second crack detection line surrounds at least part of the first crack detection line;
   at least one first electrostatic discharge circuit located in the peripheral area, each first electrostatic discharge circuit comprising at least one first thin film transistor, the at least one first thin film transistor comprising a first gate, and the at least one first electrostatic discharge circuit being electrically insulated from the first crack detection line;
   at least one second electrostatic discharge circuit located in the peripheral area and electrically connected to the second crack detection line, each second electrostatic discharge circuit comprising at least one second thin film transistor, the at least one second thin film transistor comprising a second gate, wherein the second gate is electrically connected to the first gate;
   a plurality of sub-pixels located in the display area and comprising test sub-pixels and non-test sub-pixels; and
   a cell test circuit located in the peripheral area and electrically connected to at least one of the plurality of sub-pixels, the first crack detection line, or the second crack detection line respectively, wherein the cell test circuit comprises at least one test thin film transistor, the at least one test thin film transistor comprises a test gate, and the test gate is not electrically connected to the first gate or the second gate.

2. The display substrate according to claim 1, wherein the first crack detection line comprises a first end and a second end, the first end of the first crack detection line being configured to input a first electrical-signal detection signal, and the second end thereof being configured to output a second electrical-signal detection signal.

3. The display substrate according to claim 1, wherein:
   each test thin film transistor comprises a source and a drain, the at least one test thin film transistor comprises a first set of test thin film transistors, and sources or drains of the first set of test thin film transistors are electrically connected to the test sub-pixels; and
   the second crack detection line comprises a first end and a second end, the first end of the second crack detection line being configured to input a bright-line detection signal, the second end thereof being electrically connected to the drains or sources of the first set of test thin film transistors.

4. The display substrate according to claim 3, wherein the at least one test thin film transistor further comprises a second set of test thin film transistors, sources or drains of the second set of test thin film transistors being electrically connected to the non-test sub-pixels.

5. The display substrate according to claim 3, wherein:
   the at least one test thin film transistor is a P-type thin film transistor; and/or
   the first crack detection line comprises a first segment of crack detection line and a second segment of crack detection line that are in mirror symmetry, and the second crack detection line comprises a first segment of crack detection line and a second segment of crack detection line that are in mirror symmetry; and/or
   the first gate and the second gate are in an integral structure.

6. The display substrate according to claim 1, further comprising:

a common electrode located in the peripheral area and surrounding the display area, wherein the second gate and the first gate are electrically connected to the common electrode respectively.

7. The display substrate according to claim 6, wherein:
the at least one first thin film transistor comprises an active layer, and a source and a drain located on one side of the gate away from the base substrate, the source and the drain of the at least one first thin film transistor being electrically insulated from the first crack detection line, and the first gate being located on one side of the active layer away from the base substrate; and
the at least one second thin film transistor comprises an active layer, and a source and a drain located on one side of the gate away from the base substrate, the source and the drain of the at least one second thin film transistor being electrically connected to the second crack detection line, and the second gate being located on one side of the active layer away from the base substrate.

8. The display substrate according to claim 6, wherein:
the display area comprises a first boundary, a second boundary, a third boundary, and a fourth boundary;
the peripheral area comprises a first peripheral area located outside the first boundary, a second peripheral area located outside the second boundary, a third peripheral area located outside the third boundary, and a fourth peripheral area located outside the fourth boundary; and
the common electrode comprises a first portion located in the first peripheral area and a second portion located in the second peripheral area, the third peripheral area and the fourth peripheral area, and the first gate of the at least one first thin film transistor and the second gate of the at least one second thin film transistor are electrically connected to the first portion of the common electrode respectively.

9. The display substrate according to claim 8, wherein at least part of the second crack detection line located in the first peripheral area is located in a same layer as and have a same material as the source and the drain of the at least one second thin film transistor, and at least part of the second crack detection line located in the second peripheral area, the third peripheral area and the fourth peripheral area is located in a same layer as and have a same material as the gate of the at least one second thin film transistor.

10. The display substrate according to claim 9, wherein part of the first crack detection line or the second crack detection line located in the first peripheral area is in a U-shape or L-shape, and a bent part of the U-shape or L-shape has a chamfer.

11. The display substrate according to claim 1, wherein the first electrostatic discharge circuit and the second electrostatic discharge circuit are respectively located at both sides of the cell test circuit, and are in mirror symmetry.

12. The display substrate according to claim 1, wherein:
the source and the drain of the at least one first thin film transistor are shorted through a metal layer, and are located in a same layer as and have a same material as the metal layer; and
the source and the drain of the at least one second thin film transistor are shorted through the metal layer, and are located in a same layer as and have a same material as the metal layer.

13. A display device comprising the display substrate according to claim 1.

14. A crack detection method of a display substrate, the display substrate comprising:
a base substrate comprising a display area and a peripheral area surrounding the display area;
a first crack detection line located in the peripheral area and surrounding the display area, the first crack detection line comprising a first end and a second end;
a second crack detection line located in the peripheral area and surrounding the display area, wherein at least part of the second crack detection line surrounds at least part of the first crack detection line;
at least one first electrostatic discharge circuit located in the peripheral area and electrically insulated from the first crack detection line, each first electrostatic discharge circuit comprising at least one first thin film transistor, the at least one first thin film transistor comprising a first gate, and the at least one first electrostatic discharge circuit being electrically insulated from the first crack detection line;
at least one second electrostatic discharge circuit located in the peripheral area and electrically connected to the second crack detection line, each second electrostatic discharge circuit comprising at least one second thin film transistor, the at least one second thin film transistor comprising a second gate, wherein the second gate is electrically connected to the first gate;
a plurality of sub-pixels located in the display area and comprising test sub-pixels and non-test sub-pixels; and
a cell test circuit located in the peripheral area and electrically connected to at least one of the plurality of sub-pixels, the first crack detection line, or the second crack detection line respectively, wherein the cell test circuit comprises at least one test thin film transistor, the at least one test thin film transistor comprises a third gate, and the third gate is not electrically connected to the first gate or the second gate,
the crack detection method comprising:
inputting a first electrical-signal detection signal to the first end of the first crack detection line;
receiving a second electrical-signal detection signal from the second end of the first crack detection line; and
deciding whether there is a crack in the display substrate according to the first electrical-signal detection signal and the second electrical-signal detection signal.

15. The crack detection method according to claim 14, wherein the deciding whether there is a crack in the display substrate according to the first electrical-signal detection signal and the second electrical-signal detection signal comprises:
determining a resistance value between the first end of the first crack detection line and the second end thereof according to the first electrical-signal detection signal and the second electrical-signal detection signal; and
deciding whether there is a crack in the display substrate according to a comparison result of the resistance value and a resistance threshold.

16. The crack detection method according to claim 14, wherein
each test thin film transistor comprises a source and a drain, the at least one test thin film transistor comprising a first set of test thin film transistors, and sources or drains of the first set of test thin film transistors being electrically connected to the test sub-pixels; and
the second crack detection line comprises a first end and a second end, the first end of the second crack detection line being configured to input a bright-line detection signal, and a second end thereof being electrically connected to the drains or sources of the first set of test thin film transistors, and the crack detection method further comprises:

inputting a level signal, which makes the at least one test thin film transistor to turn off, to the at least one test thin film transistor.

17. A crack detection method of a display substrate, the display substrate comprising:

a base substrate comprising a display area and a peripheral area surrounding the display area;

a plurality of sub-pixels located in the display area and comprising test sub-pixels and non-test sub-pixels;

a cell test circuit located in the peripheral area and electrically connected to the plurality of sub-pixels, the cell test circuit comprising at least one test thin film transistor, each test thin film transistor comprising a source, a drain and a test gate, the at least one test thin film transistor comprising a first set of test thin film transistors, and sources or drains of the first set of test thin film transistors being electrically connected to the test sub-pixels;

a first crack detection line located in the peripheral area and surrounding the display area, and electrically connected to the cell test circuit;

a second crack detection line located in the peripheral area and surrounding the display area, the second crack detection line comprising a first end and a second end, the first end of the second crack detection line being configured to input a bright-line detection signal, and the second end thereof being electrically connected to the drains or sources of the first set of test thin film transistors, wherein at least part of the second crack detection line surrounds at least part of the first crack detection line;

at least one first electrostatic discharge circuit located in the peripheral area, each comprising at least one first thin film transistor, the at least one first thin film transistor comprising a first gate, and the at least one first electrostatic discharge circuit being electrically insulated from the first crack detection line; and at least one second electrostatic discharge circuit located in the peripheral area and electrically connected to the second crack detection line, each comprising at least one second thin film transistor, the at least one second thin film transistor comprising a second gate, wherein the second gate is electrically connected to the first gate, and the test gate is not electrically connected to the first gate or the second gate, the crack detection method comprising:

inputting a first level signal to gates of the first set of test thin film transistors to turn on the first set of test thin film transistors; and inputting a bright-line detection signal to the first end of the first crack detection line to detect an emission state of the test sub-pixels.

18. The crack detection method according to claim 17, wherein the bright-line detection signal is a constant voltage signal, a voltage value of the constant voltage signal being greater than a voltage threshold.

19. The crack detection method according to claim 18, wherein the at least one test thin film transistor further comprises a second set of test thin film transistors, sources or drains of the second set of test thin film transistors being electrically connected to the non-test sub-pixels, and the crack detection method further comprises:

inputting the first level signal to gates of the second set of test thin film transistors to turn on the second set of test thin film transistors, and inputting a second level signal to the drains or sources of the second set of test thin film transistors to make the non-test sub-pixels be in a dark state.

* * * * *